(12) United States Patent
Abdelhalem et al.

(10) Patent No.: US 9,831,838 B2
(45) Date of Patent: Nov. 28, 2017

(54) LOW NOISE AMPLIFIER ARCHITECTURE FOR CARRIER AGGREGATION RECEIVERS

(71) Applicant: Nvidia Corporation, Santa Clara, CA (US)

(72) Inventors: Sherif Abdelhalem, San Diego, CA (US); Frank Zhang, Plano, TX (US); Abdellatif Bellaouar, Richardson, TX (US); Sherif Embabi, Allen, TX (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 14/839,055

(22) Filed: Aug. 28, 2015

(65) Prior Publication Data

US 2016/0173042 A1    Jun. 16, 2016

Related U.S. Application Data

(60) Provisional application No. 62/092,675, filed on Dec. 16, 2014.

(51) Int. Cl.
*H03F 3/68* (2006.01)
*H03F 3/193* (2006.01)
*H03F 1/22* (2006.01)
*H03F 3/21* (2006.01)
*H03F 3/72* (2006.01)
(Continued)

(52) U.S. Cl.
CPC .............. *H03F 3/193* (2013.01); *H03F 1/223* (2013.01); *H03F 3/211* (2013.01); *H03F 3/72* (2013.01); *H03F 1/0288* (2013.01); *H03F 1/07* (2013.01); *H03F 3/602* (2013.01); *H03F 2200/111* (2013.01); *H03F 2200/294* (2013.01);
(Continued)

(58) Field of Classification Search
CPC ....................................................... H03F 3/193
USPC ............. 330/295, 296, 283, 124 R, 277, 301
See application file for complete search history.

(56) References Cited

U.S. PATENT DOCUMENTS 8,102,213 B2 *   1/2012   Tasic ....................... H03F 1/223
                                                    330/283
2013/0315348 A1   11/2013   Tasic et al.
(Continued)

OTHER PUBLICATIONS

Shaeffer, Derek, et al., "A 1.5-V, 1.5-GHz CMOS Low Noise Amplifier," Solid-State Circuits, IEEE Journal of, vol. 32, No. 5, pp. 745-759, May 1997.

*Primary Examiner* — Khanh V Nguyen
*Assistant Examiner* — Khiem Nguyen

(57) ABSTRACT

A low noise amplifier includes a first input transistor coupled to an input signal and a second input transistor coupled to the input signal. The low noise amplifier also includes a first output transistor, coupled between the first input transistor and a first carrier aggregation load, configured to connect the first input transistor to the first carrier aggregation load. Additionally, the low noise amplifier includes a second output transistor, coupled between the first input transistor and a second carrier aggregation load, configured to connect the first input transistor to the second carrier aggregation load. Further, the low noise amplifier includes a third output transistor, coupled between the second input transistor and the second carrier aggregation load, configured to connect the second input transistor to the second carrier aggregation load. Also included are a method of operating a low noise amplifier and an extended carrier low noise amplifier.

7 Claims, 5 Drawing Sheets

(51) Int. Cl.
*H03F 1/07* (2006.01)
*H03F 1/02* (2006.01)
*H03F 3/60* (2006.01)

(52) U.S. Cl.
CPC .. *H03F 2200/396* (2013.01); *H03F 2200/429* (2013.01); *H03F 2203/7209* (2013.01)

(56) References Cited

U.S. PATENT DOCUMENTS

| | | |
|---|---|---|
| 2013/0316669 A1 | 11/2013 | Davierwalla et al. |
| 2013/0316670 A1 | 11/2013 | Tasic et al. |
| 2014/0072001 A1 | 3/2014 | Chang et al. |
| 2014/0328436 A1 | 11/2014 | Bellaouar et al. |

\* cited by examiner

LOW NOISE AMPLIFIER ARCHITECTURE FOR CARRIER AGGREGATION RECEIVERS

This application claims the benefit of U.S. Provisional Application Ser. No. 62/092,675, filed by Sherif Abdelhalem on Dec. 16, 2014, entitled "Novel LNA Architecture for Carrier Aggregation Receivers," commonly assigned with this application and incorporated herein by reference.

TECHNICAL FIELD

This application is directed, in general, to carrier aggregation and, more specifically, to a low noise amplifier, a method of operating a low noise amplifier and an extended carrier low noise amplifier.

BACKGROUND

Carrier aggregation, both inter-carrier aggregation and intra-carrier aggregation, is used in cellular communication to increase data rates and to overcome fragmentation of assigned frequency spectrums. Low noise amplifiers are an important part of transceivers supporting carrier aggregation. The split cascode low noise amplifier, often used in these receivers, presents several operating characteristics that degrade desired performance when required to operate in both aggregation modes. In an intra-carrier aggregation mode, current from a common transconductor is divided between two loads rather than being employed by one or the other load as for an inter-carrier aggregation mode. Maintaining a constant load current for the two operating modes is challenging since transconductance has a square root dependency on current. Additionally, the inter-carrier aggregation mode provides a single-circuit amplifier noise and the intra-carrier aggregation mode provides a larger dual-circuit amplifier noise thereby providing a different amplifier noise factor between the two operating modes. So, typically, amplifier gain may be affected and the noise factor is worse when going from single to dual mode operation. What is needed in the art is an improved low noise amplifier that overcomes these problems.

SUMMARY

Embodiments of the present disclosure provide a low noise amplifier, a method of operating a low noise amplifier and an extended carrier low noise amplifier.

In one embodiment, the low noise amplifier includes a first input transistor coupled to an input signal and a second input transistor coupled to the input signal. The low noise amplifier also includes a first output transistor, coupled between the first input transistor and a first carrier aggregation load, configured to connect the first input transistor to the first carrier aggregation load. Additionally, the low noise amplifier includes a second output transistor, coupled between the first input transistor and a second carrier aggregation load, configured to connect the first input transistor to the second carrier aggregation load. Further, the low noise amplifier includes a third output transistor, coupled between the second input transistor and the second carrier aggregation load, configured to connect the second input transistor to the second carrier aggregation load.

In another aspect, the method of operating a low noise amplifier includes providing a first input current based on an input signal and directing the first input current to a first carrier aggregation load for a first operating mode or directing the first input current to a second carrier aggregation load for a second operating mode. The method also includes providing a second input current based on the input signal and directing the first input current to the first carrier aggregation load and the second input current to the second carrier aggregation load for a third operating mode.

In yet another aspect, the extended carrier low noise amplifier includes an input carrier aggregation stage having a first input transistor coupled to an input signal and a first output transistor coupled between the first input transistor and a first carrier aggregation load. The extended carrier low noise amplifier also includes additional cascaded carrier aggregation extension stages coupled to the input carrier aggregation stage, wherein each of the additional cascaded carrier aggregation extension stages includes a first additional output transistor coupled between the first input transistor and an additional carrier aggregation load, an additional input transistor coupled to the input signal and a second additional output transistor coupled between the additional input transistor and the additional carrier aggregation load.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which.

DETAILED DESCRIPTION

Embodiments of the present disclosure present a new architecture for a low noise amplifier that may be employed in a carrier aggregation receiver. The low noise amplifier employs an additional high input impedance amplifier in parallel with a conventional common-source inductively degenerated amplifier to sense an input signal. This new topology avoids gain variations and noise factor degradation associated with a split cascode topology. Additionally, the new topology can be extended to more carriers with minimal impact on single carrier operation.

Therefore, these low noise amplifier embodiments provide a consistent performance for inter-carrier aggregation and intra-carrier aggregation applications. Switching between the two operating modes is seamless and associated gains, noise figures and input signal sensitivity are consistent across all operating modes.

Figure 1:
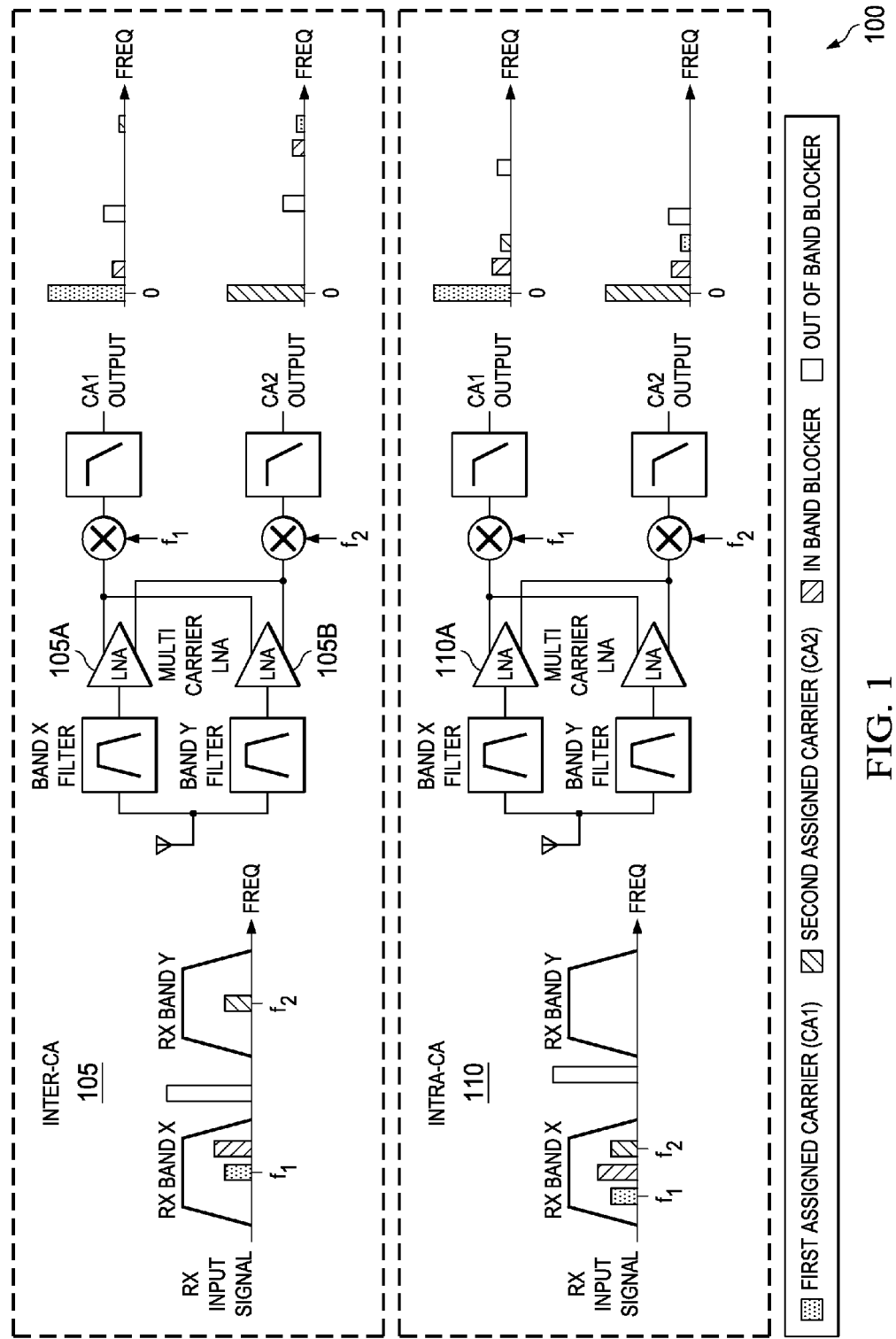
FIG. 1 illustrates examples of a carrier aggregation arrangement wherein embodiments of the present disclosure may be employed.

FIG. 1 illustrates examples of a carrier aggregation arrangement, generally designated 100, wherein embodiments of the present disclosure may be employed. Examples for the carrier aggregation system 100 include an inter-carrier aggregation example 105 and an intra-carrier aggregation example 110. As noted earlier, an operating entity may not be allowed to employ every frequency band in a spectrum of frequencies, and therefore, carrier aggregation may be used to increase data rate or throughput while overcoming spectrum fragmentation.

The inter-carrier aggregation (Inter-CA) example 105 employs separate receive bands (RX Band X and RX Band Y) having carrier frequencies of $f_1$ and $f_2$, respectively. These bands are respectively received by two low noise amplifiers 105A and 105B and processed through corresponding mixers and low pass filters to provide base band outputs for each of the carrier frequencies $f_1$ and $f_2$, as shown.

The two carrier frequencies $f_1$ and $f_2$ are at different frequencies, as shown, where Band X may be centered at 900 MHz, and Band Y may be centered at 2 GHz. This arrangement requires two output mixers at 900 MHz and 2 GHz, respectively. The two receive paths will down-convert these two bands of information, and they will be recombined at a base band. When CA1 and CA2 outputs are provided in digital format, they provide a total bandwidth equal to the sum of the two bands.

The intra-carrier aggregation (Intra-CA) example 110 employs a single receive band (RX Band X) containing both carrier frequencies $f_1$ and $f_2$, as shown. This band is received by the single low noise amplifier 110A and processed through corresponding mixers and low pass filters to provide base band outputs for each of the carrier frequencies $f_1$ and $f_2$, as shown.

Although close in frequency, the carrier frequencies $f_1$ (905 MHz) and $f_2$ (920 MHz) are somewhat different, and they can be down-converted together to provide a summation of bandwidths centered at carrier frequencies $f_1$ and $f_2$. A difference may be seen here in the low noise amplifier configuration. The carrier frequencies $f_1$ and $f_2$ are close enough to allow the use of only one low noise amplifier, which is broadband enough to amplify both of the signal frequencies f1 and f2.

Figure 2:
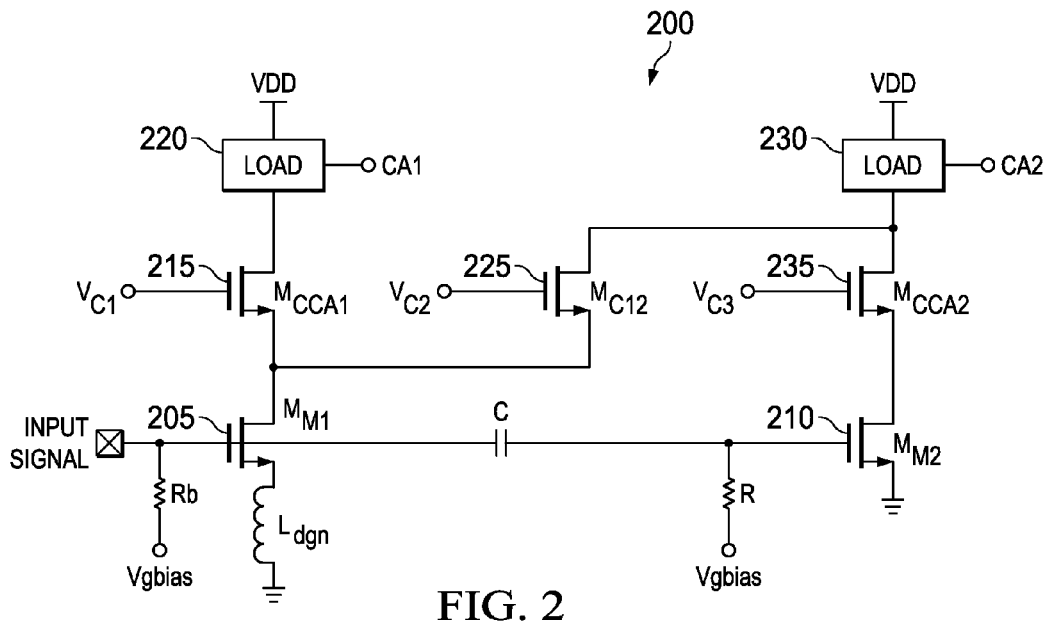
FIG. 2 illustrates a schematic diagram of a low noise amplifier constructed according to the principles of the present disclosure.

FIG. 2 illustrates a schematic diagram of a low noise amplifier, generally designated 200, constructed according to the principles of the present disclosure. FIG. 2 provides the structure of the low noise amplifier 200 that includes a first input transistor 205, a second input transistor 210, a first output transistor 215, a first carrier aggregation load 220, a second output transistor 225, a second carrier aggregation load 230 and a third output transistor 235. The low noise amplifier 200 further includes a first input bias resistor Rb and a second input bias resistor R that are connected to a gate bias voltage $V_{gbias}$.

As may be seen in FIG. 2, the first input transistor 205 is coupled to an input signal. The second input transistor 210 is also coupled to the input signal. The first output transistor 215 is coupled between the first input transistor 205 and the first carrier aggregation load 220 and is configured to connect the first input transistor 205 to the first carrier aggregation load 220.

Additionally, the second output transistor 225 is coupled between the first input transistor 205 and the second carrier aggregation load 230 and is configured to connect the first input transistor 205 to the second carrier aggregation load 230. Also, the third output transistor 235 is coupled between the second input transistor 210 and the second carrier aggregation load 230 and is configured to connect the second input transistor 210 to the second carrier aggregation load 230.

The first input transistor 205 is biased by the gate bias voltage $V_{gbias}$ through the first input bias resistor Rb to operate continuously and employs a source degeneration inductor $L_{dgn}$. This mode provides a resistive part for the input impedance for the first input transistor 205 and allows the first input transistor 205 and its degeneration inductor $L_{dgn}$ to be sized to match an input impedance requirement (e.g., 50 ohms) for the input signal. These conditions remain constant throughout operation of the low noise amplifier 200.

The second input transistor 210 is biased by the gate bias voltage $V_{gbias}$ through the second input bias resistor R and is coupled to the input signal through a coupling capacitor C. Since the gate bias voltage $V_{gbias}$ is applied continuously, a stable input capacitance for the second input transistor 210 is achieved whatever its current conductive state. This stable input capacitance provides a consistent loading for the input signal regardless of the operating mode of the low noise amplifier 200. Additionally, the second input transistor 210 may be sized to reduce this input capacitance by employing a small gate-length transistor.

A first single carrier operating mode (CA1 only operating) is achieved when the first output transistor 215 (activated by a first control signal $V_{C1}$) separately connects the first input transistor 205 to the first carrier aggregation load 220 thereby activating a first load current through the first carrier aggregation load 220.

A second single carrier operating mode (CA2 only operating) is achieved when the second output transistor 225 (activated by a second control signal $V_{C2}$) separately connects the first input transistor 205 to the second carrier aggregation load 230 thereby activating the first load current through the second carrier aggregation load 230.

A dual carrier operating mode (CA1 and CA2 both operating) is achieved when the first output transistor 215 (activated by a first control signal $V_{C1}$) concurrently connects the first input transistor 205 to the first carrier aggregation load 220 and the third output transistor 235 (activated by a third control signal $V_{C3}$) concurrently connects the second input transistor 210 to the second carrier aggregation load 230 thereby activating first and second load currents through the first and second carrier aggregation loads 220, 230, respectively.

Figure 3A:
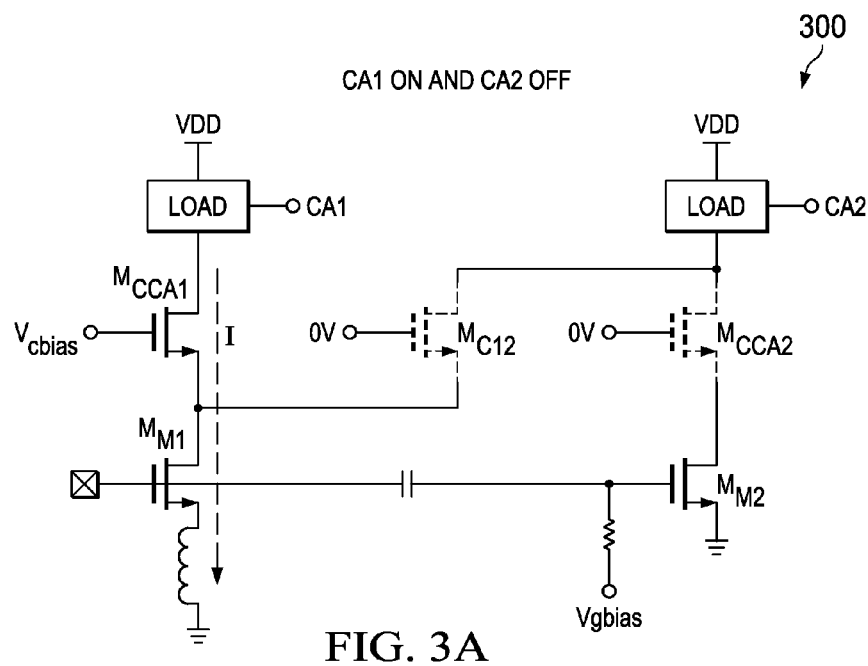
FIGS. 3A, 3B and 3C illustrate operational examples of the low noise amplifier of FIG. 2.
Figure 3B:
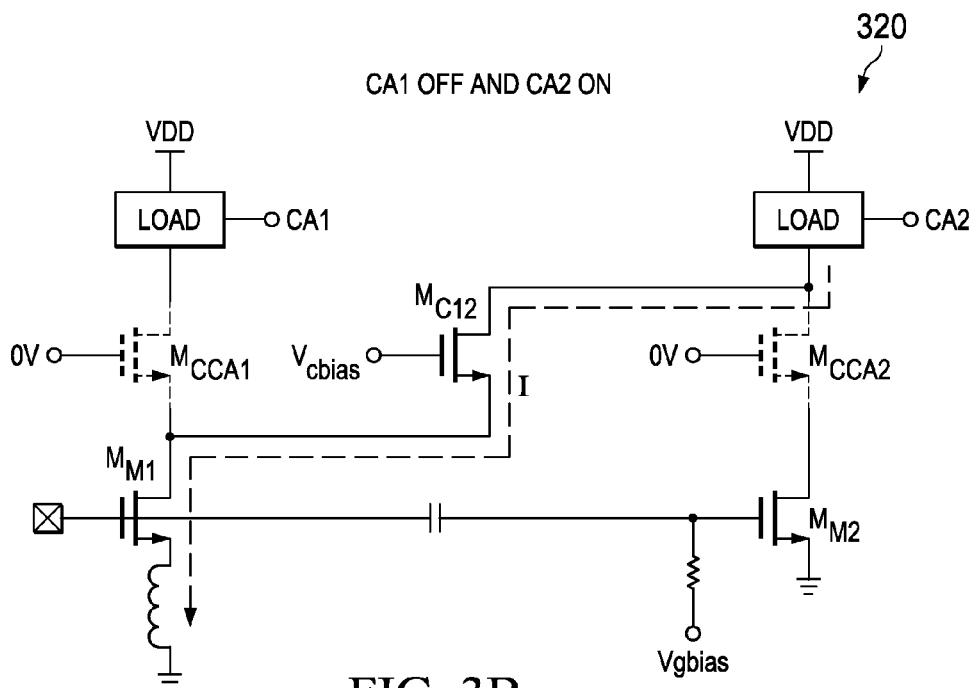
Figure 3C:
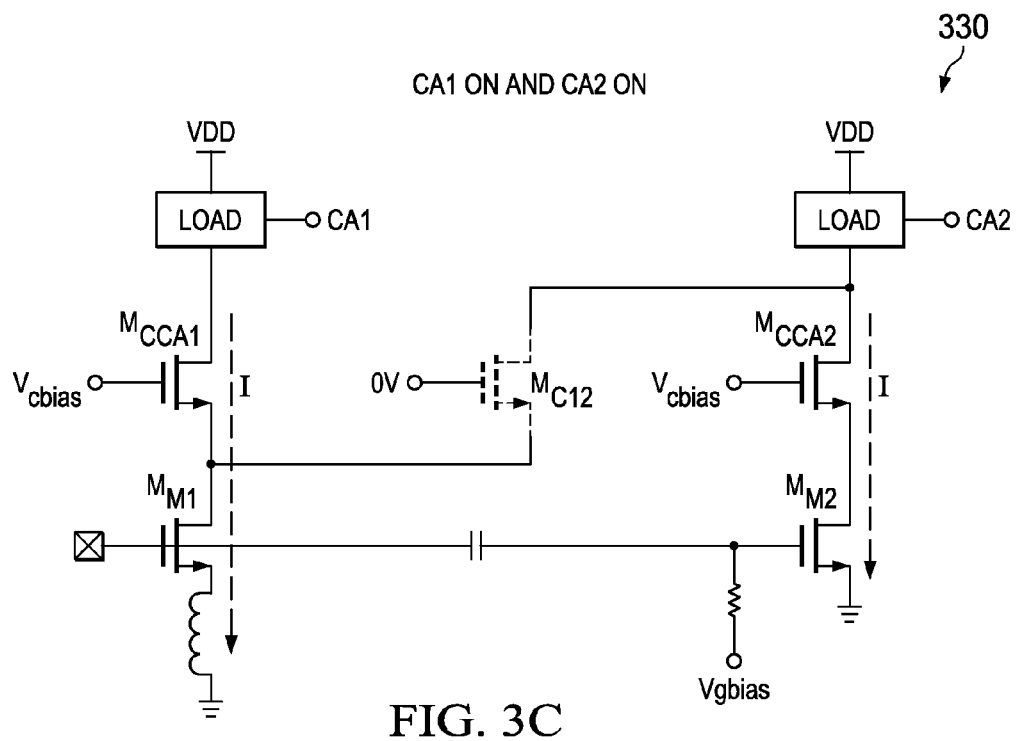

In each of these operating modes, the first and second load currents are substantially equal in value. This may be achieved by sizing the first and second input transistors 205, 210 independently to achieve this effect for the dual carrier operating mode. FIGS. 3A, 3B and 3C illustrate operational examples of the low noise amplifier 200 of FIG. 2.

FIG. 3A shows an inter-carrier aggregation (Inter-CA1) operating condition in which a first carrier band containing a first carrier frequency (e.g., RX Band X) is accommodated and a second carrier band carrying a second carrier frequency (e.g., RX Band Y) is not accommodated. This condition corresponds to the low noise amplifier (LNA) 105A of FIG. 1. Additionally, FIG. 3B shows another inter-carrier aggregation (Inter-CA2) operating condition in which the first carrier band (RX Band X) is not accommodated and the second carrier band (RX Band Y) is accommodated. This corresponds to the LNA 105B of FIG. 1.

FIG. 3C shows an intra-carrier aggregation (Intra-CA1 and Intra-CA2) operating condition in which a single carrier band (e.g., RX Band X) containing two carrier frequencies is accommodated. This corresponds to the LNA 110A of FIG. 1.

Figure 4:
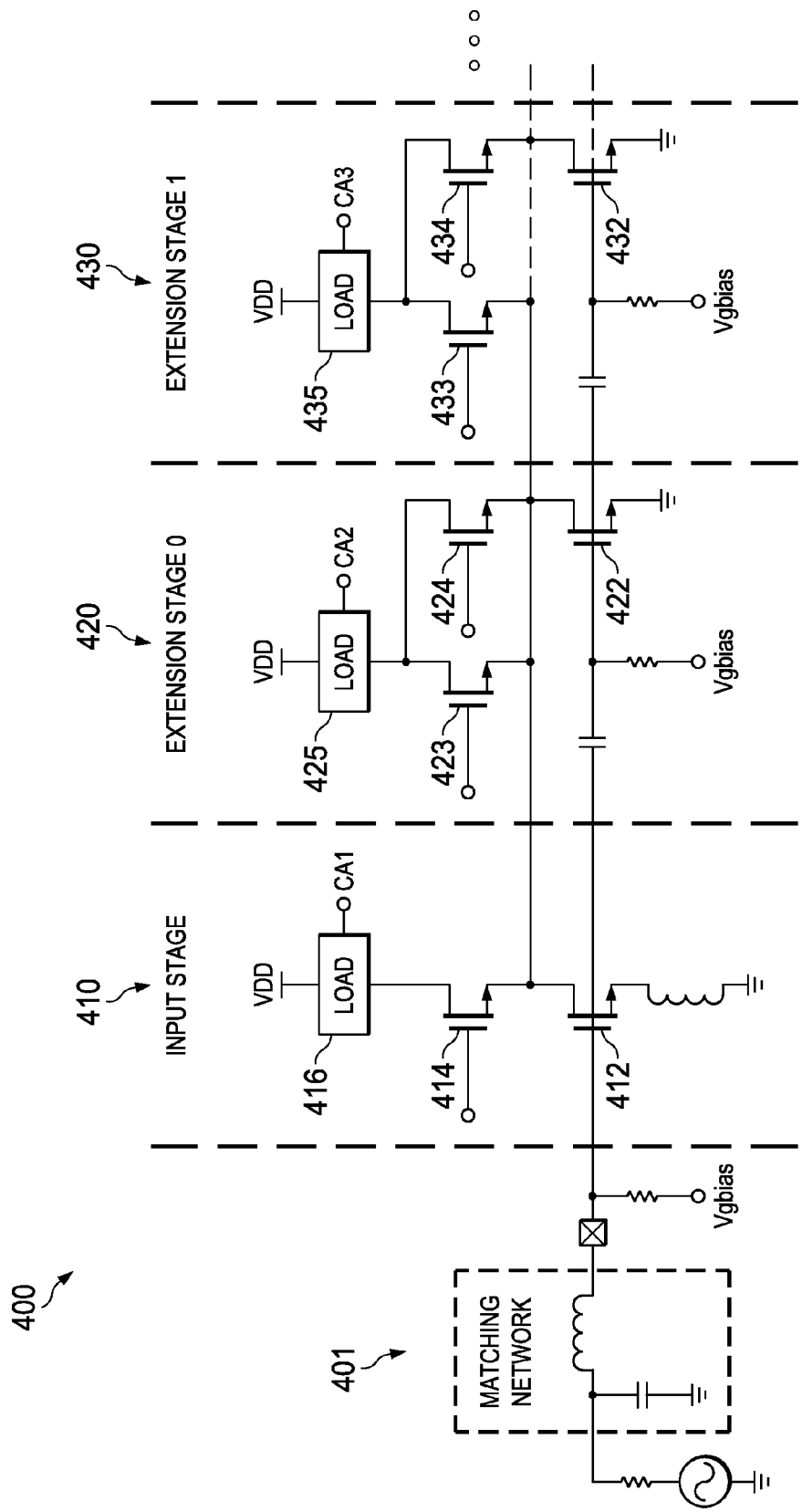
FIG. 4 illustrates an embodiment of an extended carrier low noise amplifier constructed according to the principles of the present disclosure.

FIG. 4 illustrates an embodiment of an extended carrier low noise amplifier, generally designated 400, constructed according to the principles of the present disclosure. In the illustrated embodiment, the extended carrier low noise amplifier 400 includes a signal receiving and matching stage 401, an input carrier aggregation stage 410 and additional cascaded carrier aggregation extension stages 420, 430, etc.

The general structure of the low noise amplifier 200 discussed with respect to FIG. 2 readily accommodates extension beyond two carrier bands (inter-carrier aggregation) or two carrier frequencies within a single band (intra-carrier aggregation). This concept is reflected in the structure shown in FIG. 4 wherein the low noise amplifier 200 is accommodated by the input stage 410 and the extension stage 420. Employing the extension stage 430 provides the ability to accommodate three carrier bands for inter-carrier aggregation and three carrier frequencies within a single band for intra-carrier aggregation. The carrier aggregation extensions may continue until the total input capacitance of the paralleled additional input transistors becomes too great to allow proper loading of the input signal.

The input carrier aggregation stage 410 employs a first input transistor 412 coupled to the signal receiving and matching stage 401, a first output transistor 414 coupled between the first input transistor 412 and a first carrier aggregation load 416.

The additional cascaded carrier aggregation extension stages (420, 430, etc.) are coupled to the input carrier aggregation stage 410, wherein each of the additional cascaded carrier aggregation extension stages (420, 430, etc.) includes a first additional output transistor (423, 433, etc.) coupled between the first input transistor 412 and an additional carrier aggregation load (425, 435, etc.); an additional input transistor (422, 432, etc.) coupled to the input signal through the signal receiving and matching stage 401; and a second additional output transistor (424, 434, etc.) coupled between the additional input transistor (422, 432, etc.) and the additional carrier aggregation load (425, 435, etc.).

The first output transistor 414 separately connects the first input transistor 412 to the first carrier aggregation load 416 for a first single carrier operating mode. The first additional output transistor (423, 433, etc.) separately connects the first input transistor 412 to the additional carrier aggregation load (425, 435, etc.) for an additional single carrier operating mode.

The first output transistor 414 connects the first input transistor 412 to the first carrier aggregation load 416 and the second additional output transistor (424, 434, etc.) connects the additional input transistor (422, 432, etc.) to the additional carrier aggregation load (425, 435, etc.) for a concurrent carrier operating mode.

Figure 5:
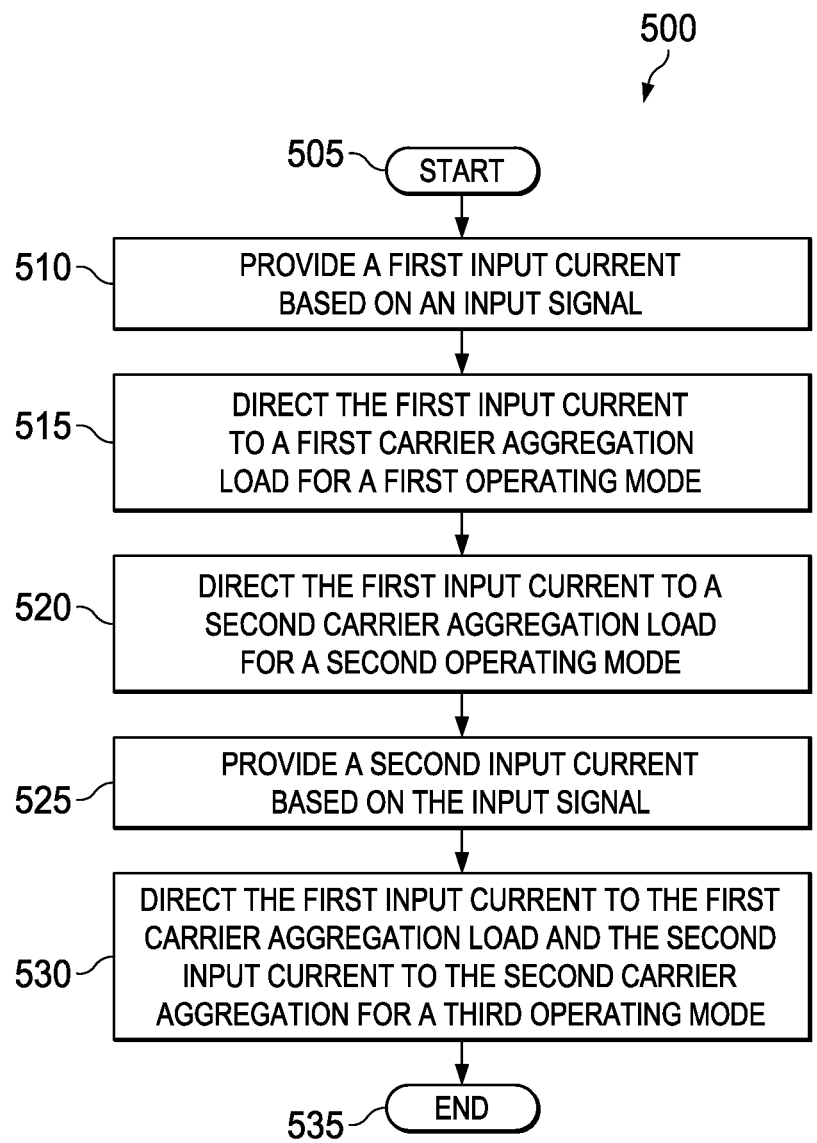
FIG. 5 illustrates a flow diagram of an embodiment of a method of operating a low noise amplifier carried out according to the principles of the present disclosure.

FIG. 5 illustrates a flow diagram of an embodiment of a method of operating a low noise amplifier, generally designated 500, carried out according to the principles of the present disclosure. The method 500 starts in a step 505 and in a step 510, a first input current based on an input signal is provided. Then, the first input current is directed to a first carrier aggregation load for a first operating mode, in a step 515. The first input current is directed to a second carrier aggregation load for a second operating mode, in a step 520. A second input current based on the input signal is provided, in a step 525. The first input current is directed to the first carrier aggregation load and the second input current to the second carrier aggregation load for a third operating mode, in a step 530.

In one embodiment, the first input current is provided by a transconductor operating continuously in a low input impedance mode. Correspondingly, the low input impedance mode provides an input impedance required for the input signal. In another embodiment, the second input current is provided by a transconductor having a constant bias that forms a stable and minimized shunting capacitive load (i.e., a constant high impedance load) for the input signal.

In yet another embodiment, the first operating mode is a first single carrier aggregation operating mode. In still another embodiment, the second operating mode is a second single carrier aggregation operating mode. In a further embodiment, the third operating mode is a dual carrier aggregation operating mode. In the dual carrier operating mode, load currents are substantially equal in value. The method 500 ends in a step 535.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. An extended carrier low noise amplifier, comprising:
   an input carrier aggregation stage having a first input transistor coupled to an input terminal and a first output transistor coupled between the first input transistor and a first carrier aggregation load, and
   additional cascaded carrier aggregation extension stages coupled to the input carrier aggregation stage, wherein each of the additional cascaded carrier aggregation extension stages includes a first additional output transistor coupled between the first input transistor and an additional carrier aggregation load; an additional input transistor coupled to the input terminal; and a second additional output transistor coupled between the additional input transistor and the additional carrier aggregation load.

2. The extended carrier low noise amplifier as recited in claim 1 wherein the first output transistor separately connects the first input transistor to the first carrier aggregation load for a first single carrier operating mode.

3. The extended carrier low noise amplifier as recited in claim 1 wherein the first additional output transistor separately connects the first input transistor to the additional carrier aggregation load for an additional single carrier operating mode.

4. The extended carrier low noise amplifier as recited in claim 1 wherein the first output transistor connects the first input transistor to the first carrier aggregation load and the second additional output transistor connects the additional input transistor to the additional carrier aggregation load for a concurrent carrier operating mode.

5. The extended carrier low noise amplifier as recited in claim 1 wherein the first input transistor is configured to operate continuously in a low input impedance mode.

6. The extended carrier low noise amplifier as recited in claim 5 wherein the low input impedance mode provides an input impedance required for an input signal.

7. The extended carrier low noise amplifier as recited in claim 1 wherein the additional input transistor is configured to operate with a constant bias voltage to provide a stable and minimized shunting capacitive load for an input signal.

* * * * *